(12) United States Patent
Yanagisawa et al.

(10) Patent No.: US 6,908,566 B2
(45) Date of Patent: Jun. 21, 2005

(54) LOCAL DRY ETCHING METHOD

(75) Inventors: Michihiko Yanagisawa, Sagamihara (JP); Kazuyuki Tsuruoka, Zama (JP)

(73) Assignee: Speedfam Co., Ltd., Ayase (JP)

( * ) Notice: Subject to any disclaimer, the term of this patent is extended or adjusted under 35 U.S.C. 154(b) by 253 days.

(21) Appl. No.: 10/419,199

(22) Filed: Apr. 21, 2003

(65) Prior Publication Data

US 2003/0199168 A1 Oct. 23, 2003

(30) Foreign Application Priority Data

Apr. 22, 2002 (JP) .................................. 2002-119875

(51) Int. Cl.$^7$ ............................................. H01L 21/00
(52) U.S. Cl. ........................... 216/38; 216/60; 216/67; 438/706
(58) Field of Search .................. 216/38, 60, 67; 438/706

(56) References Cited

U.S. PATENT DOCUMENTS

| | | | | |
|---|---|---|---|---|
| 6,159,388 | A | * 12/2000 | Yanagisawa et al. | ......... 216/60 |
| 6,238,587 | B1 | * 5/2001 | Siniaguine et al. | ........... 216/59 |
| 6,280,645 | B1 | 8/2001 | Yanagisawa et al. | |
| 6,496,748 | B1 | 12/2002 | Yanagisawa et al. | |
| 2002/0104825 | A1 | 8/2002 | Yanagisawa et al. | |
| 2002/0148560 | A1 | * 10/2002 | Carr | ...................... 156/345.24 |
| 2003/0062335 | A1 | * 4/2003 | Brewer | ........................ 216/38 |

FOREIGN PATENT DOCUMENTS

JP          09-027482          1/1997

OTHER PUBLICATIONS

M. Yanagisawa et al, "Numerically Controlled Dry Etching Technology for Flattening of Si Wafer which Employs SF6/H2 Downstream Plasma," Japan Journal of Applied Physics., vol. 41, Part 1, No. 5A, pp. 2791–2795, May 2002.

* cited by examiner

*Primary Examiner*—Allan Olsen
(74) *Attorney, Agent, or Firm*—Morrison & Foerster LLP

(57) ABSTRACT

In a local dry etching method, position-thickness data of a semiconductor wafer is previously obtained by measuring the wafer surface, components of position-thickness data shorter than a predetermined spatial wavelength are cut off by filtering and nozzle-wafer relative speed for planarizing the surface is calculated using the filtered data.

5 Claims, 5 Drawing Sheets

$$Ta(x, y) = \sum_{i=-fs}^{+fs} \sum_{j=-fs}^{+fs} T(x+i, y+j) / N \quad \cdot \cdot \text{EQUATION 1}$$

WHEREIN N DENOTES NUMBER OF AREAS IN RADIUS fs ns data of the positions (position-thickness data).
LOCAL DRY ETCHING METHOD This application is based on application No. 2002-119875 filed in Japan, the content of which is hereby incorporated by reference.

BACKGROUND OF THE INVENTION

1. Field of the Invention

This invention relates to wafer planarization technology for planarizing the thickness distribution of a semiconductor wafer by local dry etching of a relatively thick portion of the semiconductor wafer with activated species gas.

2. Description of Related Art

FIG. 1 is an explanatory diagram for explaining a wafer planarization method and apparatus by means of local dry etching method with plasma. In FIG. 1, reference numeral 100 denotes a plasma generator, and activated species gas G in plasma generated in the plasma generator 100 is injected on the surface of a semiconductor wafer W from a nozzle 101. The semiconductor wafer W is placed and fixed on a stage 120, and the stage 120 is moved (scanned) horizontally at a controlled speed with respect to the nozzle 101.

The thickness of the semiconductor wafer W is different locally. Prior to local dry etching process, the thickness of divided local areas of the semiconductor wafer W is measured to obtain position data of individual areas and thickness data of the positions (position-thickness data).

The amount of removed material of respective local areas removed by local dry etching depends on the exposing time period to activated species gas G and etching profile (removing speed distribution) of a local area. Based on the above, the relative speed (nozzle-wafer relative speed) to be applied when the nozzle passes over the respective local areas is calculated so that the wafer surface is planarized throughout, and the respective local areas are scanned at the calculated speed and pitch to planarize the entire surface of the wafer. At this occasion, the nozzle moves slow on the relatively thick portion and convex portion (relatively thick portion) Wa, and moves fast relatively on the relatively thin portion.

The surface of a semiconductor wafer is uneven with various levels as shown in FIG. 2, and the unevenness causes a low yield in semiconductor device production. Among these unevennesses, an unevenness called as flatness has the spatial wavelength of about $\lambda=10^{-2}$ m or larger level and wave height of $h=10^{-7}$ to $10^{-5}$ m level. This unevenness is a target to be processed by a local dry etching apparatus. An unevenness called as nanotopography has the distribution center at the spatial wavelength of about $\lambda=10^{-3}$ m level and wave height of about $h=10^{-8}$ m level. Further, an unevenness called as micro-roughness has the distribution center at about $\lambda=10^{-6}$ m level and wavelength of about $h=10^{-9}$ m level.

A flatness measurement apparatus not only measures the above-mentioned flatness level but also detects smaller unevenness for the wavelength and wave height generally. The measurement result obtained from a flatness measurement apparatus has been used as it is as the basic data for calculating the nozzle-wafer relative speed formerly, and the measured nozzle-wafer relative speed value includes excessive acceleration and deceleration. Such nozzle-wafer relative speed that is input to a dry etching apparatus as the command value results in frequent acceleration and deceleration of a drive motor.

FIG. 3 is a graph obtained by plotting a command value (input speed) of the nozzle-wafer relative speed and the measured stage moving speed when a nozzle moves from one end to the other end of a diameter of a wafer having a diameter of 200 mm. FIG. 3 shows that there is large speed difference d between the measured value and command value and the nozzle-wafer relative speed cannot follow the command value exactly. The speed difference is absorbed in the form of instantaneous overload or out-of-step of a drive motor in a dry etching apparatus or deformation of some members of the dry etching apparatus. Such frequent acceleration and deceleration results in severe load on the drive motor and movable parts, and causes poor process precision and short machine life while the machine is used for a long time.

SUMMARY OF THE INVENTION

The present invention has been developed to control the nozzle-wafer relative speed to be given to a dry etching apparatus as the command value within minimum acceleration and deceleration and also to obtain the sufficient accuracy required for planarization by processing the position-thickness data obtained by a flatness measurement apparatus, and to thereby reduce the overload on a drive motor and deformation of members of the drive motor and to maintain the process precision and machine life.

The above-mentioned problem will be resolved by applying means described below. According to one aspect of the present invention, the invention provides a local dry etching method in which the nozzle-wafer relative speed to be given to a local dry etching apparatus is calculated using the position-thickness data of a semiconductor wafer obtained by a flatness measurement apparatus and material on the wafer surface is removed and planarized with activated species gas injected from a nozzle that is moving along the wafer surface according to the calculated nozzle-wafer relative speed. In this method, the above-mentioned position-thickness data is subjected to filtering when the nozzle-wafer relative speed is calculated to thereby cut off the component having a predetermined wavelength or shorter.

According to another aspect of the present invention, the present invention provides the local dry etching method described in the above-mentioned invention, wherein the above-mentioned predetermined spatial wavelength is 10 mm and the component having this spatial wavelength or shorter is cut off from the above-mentioned position-thickness data.

According to another aspect of the present invention, the present invention provides the local dry etching method described in the above-mentioned invention, wherein the predetermined spatial wavelength is 20 mm and the component having this spatial wavelength or shorter is cut off from the above-mentioned position-thickness data.

According to another aspect of the present invention, the present invention provides a method for processing the position-thickness data of the semiconductor wafer surface, wherein the position-thickness data of the semiconductor wafer surface measured for calculating the nozzle-wafer relative speed of the local dry etching apparatus is subjected to filtering under an assumption that the thickness data at respective positions is equal to the average value of all thickness data in a predetermined radius.

According to another aspect of the present invention, the present invention provides a method for processing the position-thickness data of the semiconductor wafer surface, wherein the above-mentioned predetermined radius is about half of the spatial wavelength to be cut off.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and together with the description, serve to explain the principles of the invention, in which.

DETAILED DESCRIPTION OF THE PREFERRED EMBODIMENTS

Now, preferred embodiments of the present invention will be described in detail while referring to the accompanying drawings.

Figure 1:
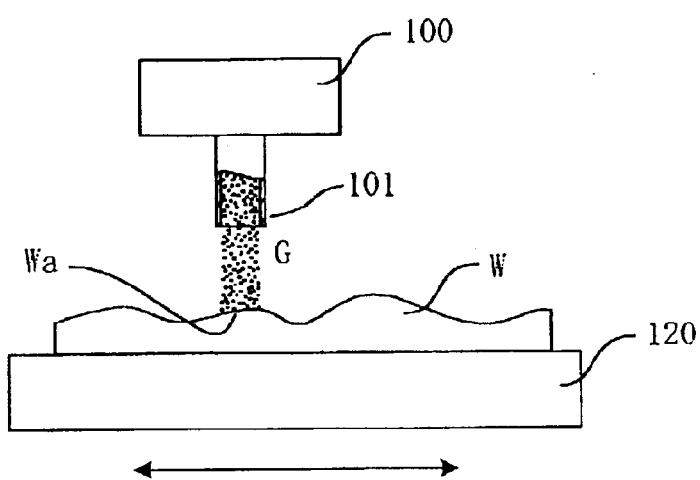
FIG. 1 is an explanatory diagram illustrating the principle of a wafer planarization method by means of local dry etching using plasma.
Figure 2:
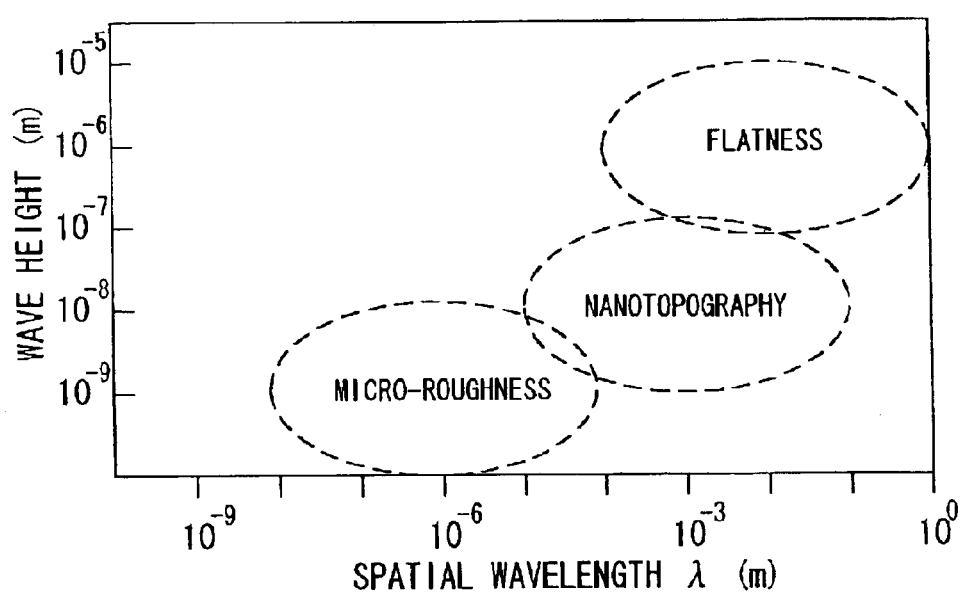
FIG. 2 is a graph for describing distribution of various unevennesses on a semiconductor wafer.
Figure 3:
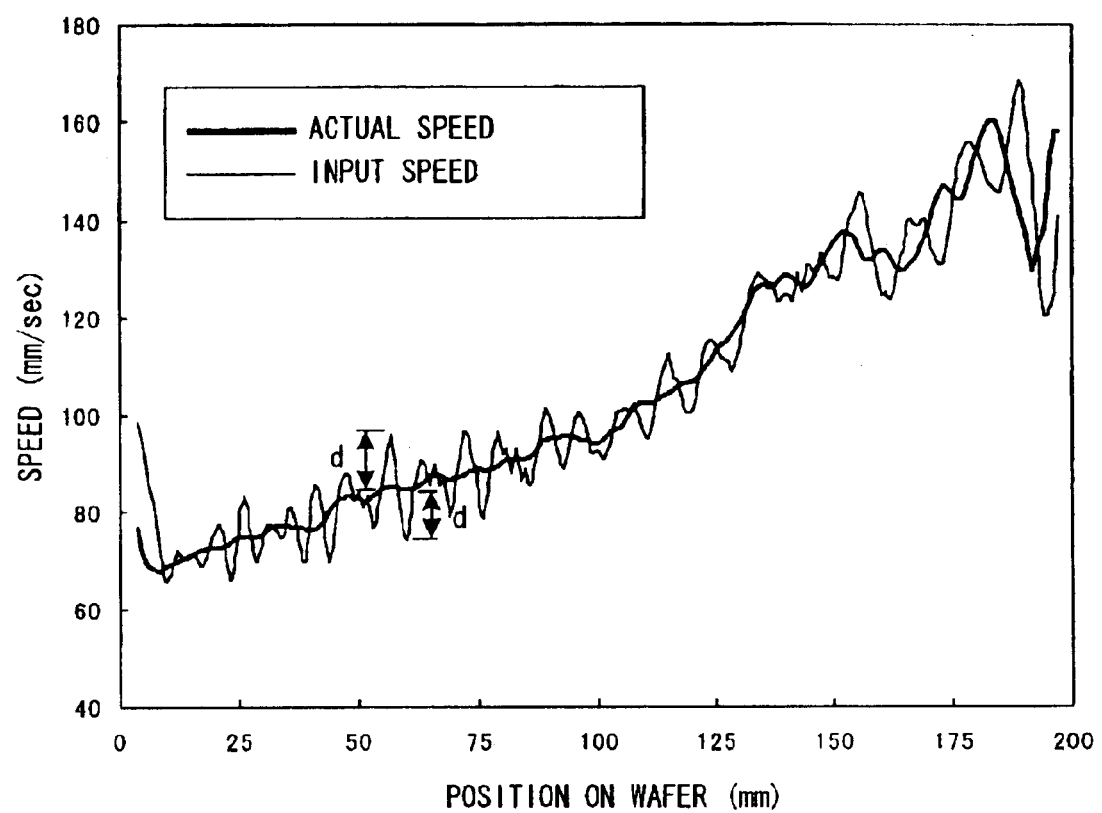
FIG. 3 is a graph obtained by plotting a command value (input speed) of the nozzle-wafer relative speed and the measured speed (actual speed) while a nozzle relatively moves from one end to the other end of a diameter of a wafer having a diameter of 200 mm.
Figure 4:
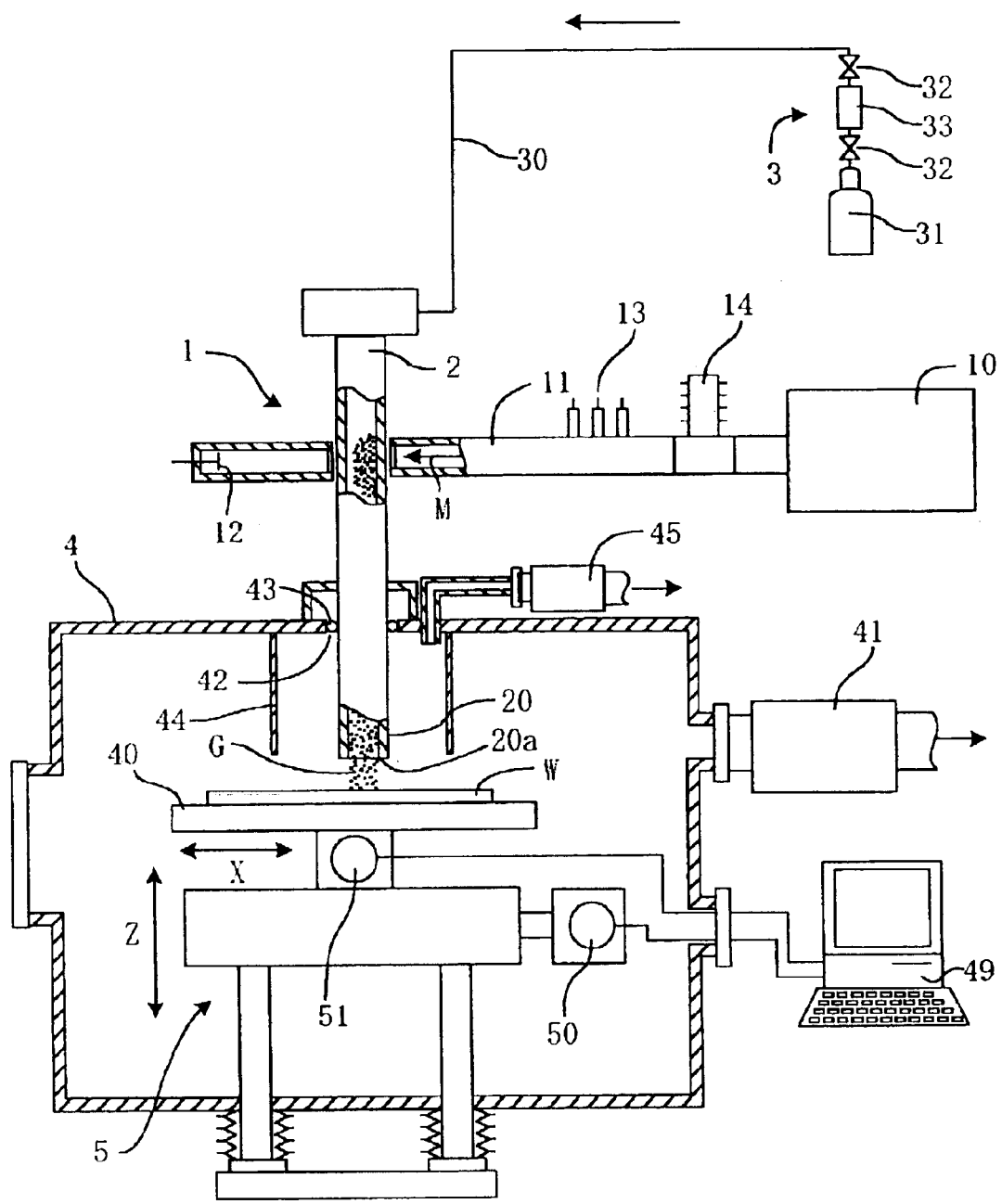
FIG. 4 is an explanatory diagram illustrating an embodiment of a local plasma etching apparatus.

FIG. 4 is an explanatory diagram describing an embodiment of a local plasma etching apparatus. The local plasma etching apparatus is provided with a plasma generator 1, gas supplier 3, and X-Y driving mechanism 5. The plasma generator 1 is an apparatus that converts gas in an alumina discharge tube to plasma to generate activated species gas G containing neutral radical and comprises a microwave oscillator 10 and waveguide 11. The microwave oscillator 10 is a magnetron that oscillates microwave M of a predetermined frequency.

The waveguide 11 that is inserted through the alumina discharge tube 2 is served to transmit the microwave M generated from the microwave oscillator 10. A reflection plate (short plunger) 12 that reflects the microwave M to form a standing wave is fixed inside in the left side end of the waveguide tube 11. A stub tuner 13 that is served for phase matching of the microwave M and an isolator 14 that is served for bending the reflected microwave M heading toward the microwave oscillator 10 in a 90° direction (surface direction in FIG. 4) are mounted on the middle of the waveguide tube 11.

The alumina discharge tube 2 that is a cylinder having a nozzle 20 at the bottom end is connected to a supply pipe 30 of the gas supplier 3 at the top end of the alumina discharge tube 2. The gas supplier 3 that is served to supply gas into the alumina discharge tube 2 has an $SF_6$ (sulfur hexafluoride) gas bomb 31, and the bomb 31 is connected to the supply pipe 30 through a valve 32 and flow controller 33. Only sulfur hexafluoride gas may be used solely, or mixed gas containing sulfur hexafluoride gas and other gases, which is formed by supplying other gases to the supply pipe 30 simultaneously, may be used.

When gas is supplied to the alumina discharge tube 2 from the gas supplier 3 and the microwave M is oscillated from the microwave oscillator 10 simultaneously, the gas is converted to plasma in the alumina discharge tube 2 and activated species gas G generated by plasma-conversion is injected from the nozzle 20 because the plasma generator 1 has the structure as described hereinabove.

A silicon wafer W is attracted electrostatically on a wafer table 40 when the silicon wafer W is placed on the wafer table 40 in a chamber 4. The chamber 4 is provided with a vacuum pump 41, and the vacuum pump 41 is served to evacuate the internal of the chamber 4 (reduce pressure). A hole 42 is formed on the top face of the chamber 4 at the center, and the nozzle 20 of the alumina discharge tube 2 is inserted into the chamber 4 from the outside through the hole 42. An O-ring 43 is fitted between the hole 42 and the alumina discharge tube 2 to keep the gap between the hole 42 and the alumina discharge tube 2 airtight. A duct 44 is provided around the nozzle 20 inserted into the hole 42, and reaction product gas generated during etching is exhausted outside from the chamber 4 by driving the vacuum pump 45.

An X-Y driving mechanism 5 is provided in the chamber 4 and supports the wafer table 40 on the bottom of the table. The X-Y driving mechanism 5 moves the wafer table 40 in the right-left direction in FIG. 4 by means of an X drive motor 50 and moves the wafer table 40 and the X drive motor 50 together in the front-back direction of the paper in FIG. 4 by means of a Y drive motor 51. In other words, the X-Y driving mechanism 5 moves the nozzle 20 in X-Y direction relatively to the silicon wafer W.

$SF_6$ gas in the bomb 31 flows into the supply pipe 30 and is supplied to the alumina discharge tube 2 when the valve 32 of the gas supplier 3 is opened. At this occasion, the flow rate of $SF_6$ gas is controlled by adjusting opening of the valve 32.

$SF_6$ gas or mixed gas containing $SF_6$ gas is supplied and the microwave oscillator 10 is driven simultaneously. The simultaneous operation converts $SF_6$ gas to plasma by microwave M and generates activated species gas G containing F (fluorine) radical (neutral activated species), namely neutral radial. The activated species gas G is guided to the nozzle 20 of the alumina discharge tube 2 thereby, and injected toward the silicon wafer W from an aperture 20a of the nozzle 20.

Figure 5:
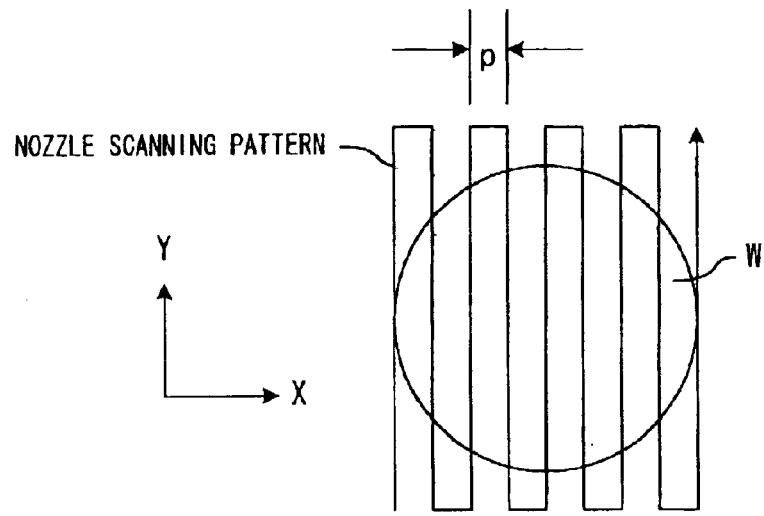
FIG. 5 is an explanatory diagram showing a scanning pattern of a nozzle 20.

A control computer 49 drives the X-Y driving mechanism 5 to move the wafer table 40 in an X-Y direction, on which the silicon wafer W has been attracted, simultaneously with injection of activated species gas. The movement in an X-Y direction allows the nozzle 20 to scan the wafer W. FIG. 5 shows the scanning pattern of the nozzle 20, and the scanning pattern covers the entire surface of the wafer W with a pitch p.

The surface material of the silicon wafer reacts chemically with activated species gas and generated gaseous product flows out from the place together with injected gas, and then the material is removed from the surface of the silicon wafer W thereby. The thickness reduction amount is controlled by controlling the relative speed between the silicon wafer W and the nozzle 20 because the amount to be removed is approximately proportional to the time period of exposure to activated species gas.

The above-mentioned relative speed is determined as described below. At first, the surface flatness of each wafer is measured previously by means of a flatness measurement apparatus. The measurement result is obtained in the form of thickness data of individual lattice-like small areas on the wafer surface (position-thickness data). The total thickness reduction amount is adjusted for all the individual areas and the nozzle-wafer relative speed that is to be applied when the nozzle 20 passes over each area is calculated so that the entire wafer surface is planarized using the etching profile data, predetermined pitch p, and position-thickness data.

As described in the section "Description of Related Art", the measurement data measured using a flatness measurement apparatus is used as it is as the position-thickness data to be used for obtaining the nozzle-wafer relative speed in the conventional local dry etching method. Consequently, the nozzle-wafer relative speed with large speed fluctuation is obtained as a calculation result. In a real dry etching apparatus, a drive motor or machine cannot follow such large speed fluctuation (acceleration), and the large speed fluctuation causes instantaneous overload or out-of-step on the drive motor or causes deformation of members. Such overload, out-of-step, and deformation cause poor process precision and short machine life of the dry etching apparatus while the apparatus is used for a long time.

Figure 6:
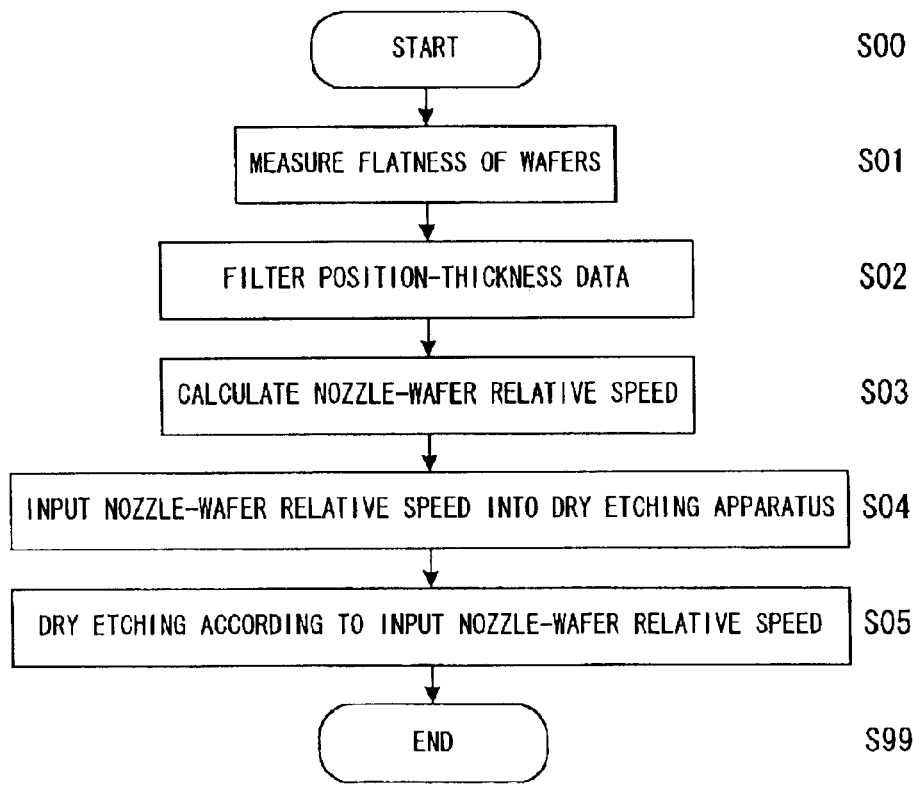
FIG. 6 is an explanatory diagram showing a local dry etching operation flow according to the present invention.

Local dry etching is carried out as described below according to the present invention. FIG. 6 is a flowchart for describing the operation. At the starting of the local dry etching operation (step S00), the flatness of the surface of each wafer is measured using a flatness measurement apparatus in step S01. In step S02, the measurement result (position-thickness data) is subjected to filtering to thereby cut off component having a predetermined spatial wavelength or shorter. This operation is carried out on each wafer, and needless noise is removed from the respective position-thickness data.

In the next step S03, the nozzle-wafer relative speed is calculated in a usual manner from the position-thickness data from which the noise has been removed. The calculated nozzle-wafer relative speed from which the noise has been removed does not include large speed fluctuation but can be used for removing excessive material as required. In step S04, the obtained nozzle-wafer relative speed is input to a control computer 49 in the dry etching apparatus, and dry etching is carried out using the nozzle-wafer relative speed (step S05)

Naturally, the magnitude of the nozzle-wafer relative speed is different depending not only on individual wafers but also on the nozzle position (relative position to a wafer) on a wafer. The operation ends when planarization of all wafers is completed (step S99). The filtering may be executed by the control computer 49 or may be executed by other computer.

Figures 7, 8:
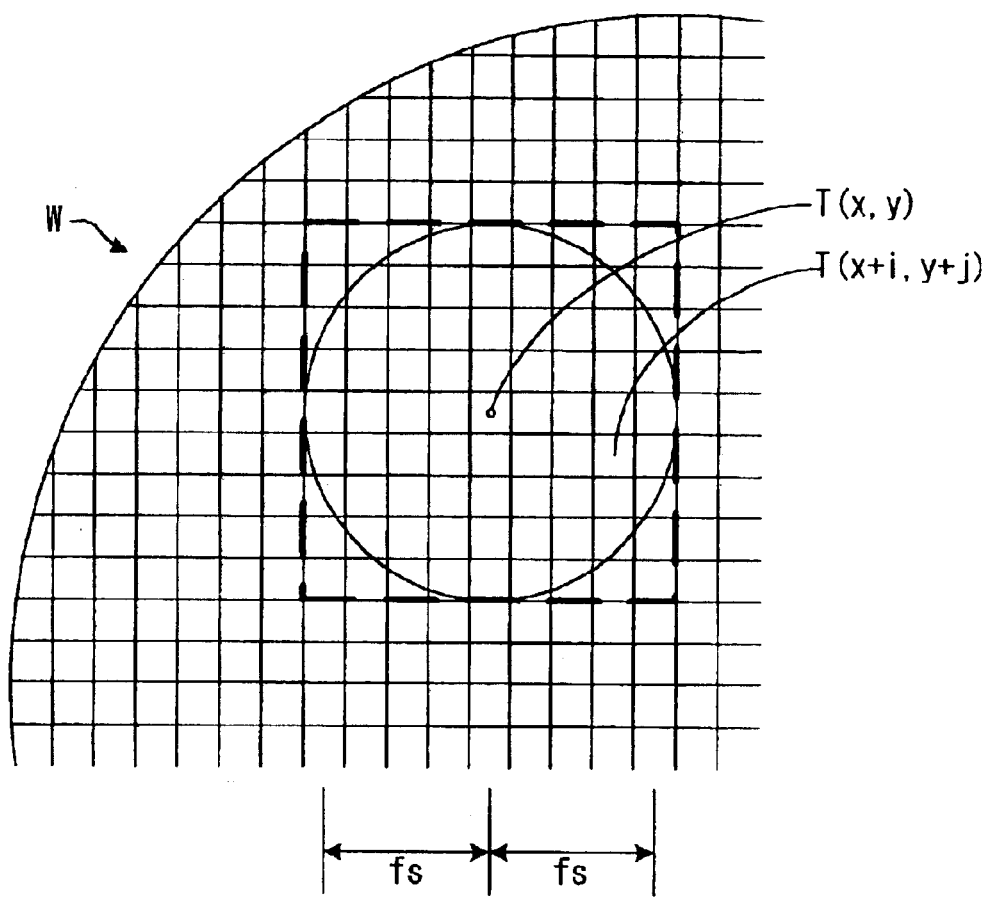
FIG. 7 is an explanatory diagram illustrating an exemplary filtering.
FIG. 8 is an equation for calculating the average value of the thickness T(x+i, y+j) on the area in a circle having a radius fs.

The filtering is described exemplarily with reference to FIG. 7. The wafer surface is divided into fine lattice-like areas, and the position-thickness data is represented as the thickness of respective divided areas T(x, y). As shown in the equation 1 of FIG. 8, an average value of the thickness T(x+i, y+j) of an area in a circle having a radius fs at the center of one certain addressed area is obtained, and this value is regarded as a new thickness Ta (x, y). A group of thickness Ta data obtained respectively for areas is regarded as new position-thickness data.

In the above-mentioned processing, the spatial wavelength component having wavelength of about double radius fs or shorter (namely, short wavelength component that is noise for the dry etching apparatus) is cut off. Otherwise, the square having a side of 2fs−1 (shown in a dashed line, FIG. 7) may be employed instead of the above-mentioned radius fs. The thickness average value is calculated by means of an arithmetic average method in the above-mentioned description, but other average calculations such as weighted average method in which peripheral data is weighted (multiplied by a factor) or other noise removing methods may be employed.

It is preferable that the cutoff wavelength is 10 mm or 20 mm depending on the nozzle diameter. The spatial wavelength component having wavelength of 10 mm or 20 mm or shorter is cut off from the measurement data thereby. In this case, the number of radius fs corresponds to 5 to 10 (numbers 5 and 10 correspond to number of areas respectively) for the side length of a divided area of 1 mm.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A local dry etching method for planarizing a surface of a semiconductor wafer in which a nozzle injecting an activated species gas is moved relatively to said wafer along said surface in a nozzle-wafer relative speed obtained by calculation using position-thickness data of said wafer and an amount of material to be removed for planarizing at each position,
    wherein components of said data shorter than a predetermined spatial wavelength are cut off by filtering.

2. A local dry etching method according to claim 1, wherein said predetermined spatial wavelength is 10 mm.

3. A local dry etching method according to claim 1, wherein said predetermined spatial wavelength is 20 mm.

4. A local dry etching method according to claim 1, wherein said filtering is that an average of all thickness data included in a circle having a predetermined radius at each position is used as a thickness data of the position.

5. A local dry etching method according to claim 4, wherein said radius is substantially half of the spatial wavelength to be cut off.

* * * * *